US005365645A

United States Patent [19]

Walker et al.

[11] Patent Number: 5,365,645

[45] Date of Patent: Nov. 22, 1994

[54] METHODS OF FABRICATING A PAGE WIDE PIEZOELECTRIC INK JET PRINTHEAD ASSEMBLY

[75] Inventors: Kelsey R. Walker, Hockley; Carol C. Scalf, Cypress; Daniel B. Granzow, Spring, all of Tex.

[73] Assignee: Compaq Computer Corporation, Houston, Tex.

[21] Appl. No.: 34,743

[22] Filed: Mar. 19, 1993

[51] Int. Cl.[5] ........................ H01L 41/22; B41J 2/045; B41J 2/16

[52] U.S. Cl. .................................. 29/25.35; 29/890.1; 310/333; 346/141

[58] Field of Search ..................... 29/25.35, 416, 890.1; 346/139 R, 140.1, 141; 310/330, 331, 332, 333; 125/901

[56] References Cited

U.S. PATENT DOCUMENTS

| | | | |
|---|---|---|---|
| 5,193,256 | 3/1993 | Ochiai et al. | 29/890.1 X |
| 5,227,813 | 7/1993 | Pies et al. | 346/140 R |

FOREIGN PATENT DOCUMENTS

| | | | |
|---|---|---|---|
| 535685 | 4/1993 | European Pat. Off. | 29/890.1 |
| 4176658 | 6/1992 | Japan | 29/890.1 |
| 4301459 | 10/1992 | Japan | 29/890.1 |
| 5064893 | 3/1993 | Japan | 29/890.1 |

*Primary Examiner*—Peter Dungba Vo
*Attorney, Agent, or Firm*—Konneker Bush Hitt & Chwang

[57] ABSTRACT

A page wide ink jet printhead body is formed using first and second series of identically configured rectangular piezoceramic blocks having widths not greater than about one inch. The individual blocks are poled in widthwise directions and secured to one another and to an upper side surface of a nonpoled piezoceramic lower body section. Horizontally equally spaced saw cuts are then made downwardly through the first and second block series, with the block width being an even multiple of the horizontal saw cut pitch, and saw cuts extending vertically through the aligned side junctures of each block series. A top, nonpoled piezoceramic body section is then secured to the top side of the second block series, the saw cuts forming within the resulting printhead body a spaced series of parallel ink receiving channels interdigitated with a spaced series of piezoelectrically deflectable sidewall actuator sections. A suitable discharge orifice plate is then secured to the body, over the front ends of the channels, and the rear ends of the channels are appropriately sealed off.

6 Claims, 2 Drawing Sheets

METHODS OF FABRICATING A PAGE WIDE PIEZOELECTRIC INK JET PRINTHEAD ASSEMBLY

BACKGROUND OF THE INVENTION

1. Field of the Invention

The present invention relates generally to ink jet printing apparatus, and more particularly relates to the fabrication of piezoelectrically operable ink jet printhead assemblies.

2. Description of Related Art

A piezoelectrically actuated ink jet printhead is a device used to selectively eject tiny ink droplets onto a print medium sheet operatively fed through a printer, in which the printhead is incorporated, to thereby form from the ejected ink droplets selected text and/or graphics on the sheet. In one representative configuration thereof, an ink jet printhead has a horizontally spaced parallel array of internal ink-receiving channels. These internal channels are covered at their front ends by a plate member through which a spaced series of small ink discharge orifices are formed. Each channel opens outwardly through a different one of the spaced orifices.

A spaced series of internal piezoelectric wall portions of the printhead body separate and laterally bound the channels along their lengths. To eject an ink droplet through a selected one of the discharge orifices, the two printhead sidewall portions that laterally bound the channel associated with the selected orifice are piezoelectrically deflected into the channel and then returned to their normal undeflected positions. The driven inward deflection of the opposite channel wall portions increases the pressure of the ink within the channel sufficiently to force a small quantity of ink, in droplet form, outwardly through the discharge orifice.

Under previous methods of constructing piezoelectric ink jet printheads the printhead body section in which the channels are to be formed is first poled, to make it piezoelectrically deflectable or "active", by imposing a predetermined voltage widthwise across the body section in a selected poling direction parallel to the desired piezoelectric deflection direction of the internal sidewall sections to be later created in the poled body section by forming a spaced series of parallel grooves therein. These grooves may be formed using a sawing, laser cutting or etching process.

A typical material used in the formation of piezoelectric ink jet printhead bodies is a piezoceramic material commonly referred to as "PZT." The proper poling of PZT requires voltages on the order of 30 to 75 volts per mil. Accordingly, the widthwise poling of a one inch wide printhead body section formed from PZT requires a poling voltage within the range or from about 30,000 volts to about 75,000 volts.

This poling voltage requirement has resulted in limiting the manufacturable width of a PZT ink jet printhead body, in a direction perpendicular to the ink discharge direction of the printhead, to about one inch since an appreciably wider PZT body section requires unacceptably higher poling voltages. For example, a ten inch wide PZT body section would require a poling voltage somewhere in the range of from about 300,000 volts to about 750,000 volts. Even if this much wider PZT body section could be properly poled at this extremely high voltage, the interior sidewall actuator sections ultimately formed from the poled section would normally exhibit the undesirable tendency to crack when piezoelectrically deflected during operation of the finished printhead.

This PZT printhead body width limitation has resulted in the inability to manufacture piezoelectric ink jet printheads in full page widths—i.e., in the 8.5"–11" width range. This necessitates the shuttling back and forth of a small width piezoelectric printhead across a print medium sheet interiorly traversing the ink jet printer, as opposed to the desirable alternative of forming the printhead in a page wide width which would permit the printhead to remain stationary during the ink jet printing process.

It would thus be desirable to provide methods for fabricating a piezoelectric ink jet printhead in a page wide printing length. It is accordingly an object of the present invention to provide such methods.

SUMMARY OF THE INVENTION

In carrying out principles of the present invention, in accordance with a preferred embodiment thereof, a page wide piezoelectric ink jet printhead assembly is fabricated by a method using individually poled rectangular blocks of a piezoelectric material, preferably a piezoceramic material such as PZT, to form the piezoelectrically deflectable sidewall actuator portions within the interior of the printhead body. Each of the individual piezoelectric body sections have opposite sides and a width extending therebetween. The widths of the body sections are essentially identical, and are preferably not substantially greater than about one inch.

After poling the individual body sections in widthwise directions, the poled body sections are intersecured to one another in a two layer array which, in turn, is secured along a first side surface of a nonpoled substrate portion of the printhead body. The poled sections in each layer are intersecured in a side-to-side abutting relationship, with the side juncture areas of each layer being aligned with the side juncture areas of the other layer, and the aligned side juncture areas lying in planes perpendicular to the substrate surface to which the inner body section layer is secured.

To form what will become the interior ink receiving channels in the finished printhead body, an equally spaced series of parallel grooves are formed through the intersecured poled body section layers from their outer side surface through their inner side surface a short distance into the substrate. A first number of the grooves extend through and remove all of the side juncture areas in the body section layers, and a second number of the grooves are interdigitated with the first number of grooves.

The grooves separate intersecured segments of the body sections which, in the finished printhead body, will define the piezoelectrically deflectable sidewall actuator sections that laterally bound the ink receiving channels along their lengths, have open front and rear ends and open side portions extending between their front and rear ends at the outer side surface of the two layer array of body sections. The grooves are preferably formed using a spaced series of saw cuts having a cut-to-cut pitch related in a predetermined manner to the original body section widths such that each of these widths is an even multiple of the saw cut pitch.

After the channel-defining grooves are formed, another nonpoled printhead body portion is secured to the outer side surface of the two layer body section array to close off the open sides of the groove, and a plate member is secured to the front side of the printhead body over the open front ends of the grooves. The plate member has a spaced series of ink discharge orifices formed therein and communicating with the front ends of the grooves. The open rear ends of the grooves are suitably sealed off, and electrical drive means are operatively connected to the actuator sidewall portions of the printhead body.

Due to the separate poling of only relatively small segments of the printhead body before it assembled, and the placement of the saw-cut grooves, the printhead may be easily given a page width length without the problems typically associated with attempting to pole a unitary piezoelectric body portion of this overall length.

DETAILED DESCRIPTION

Figure 1:
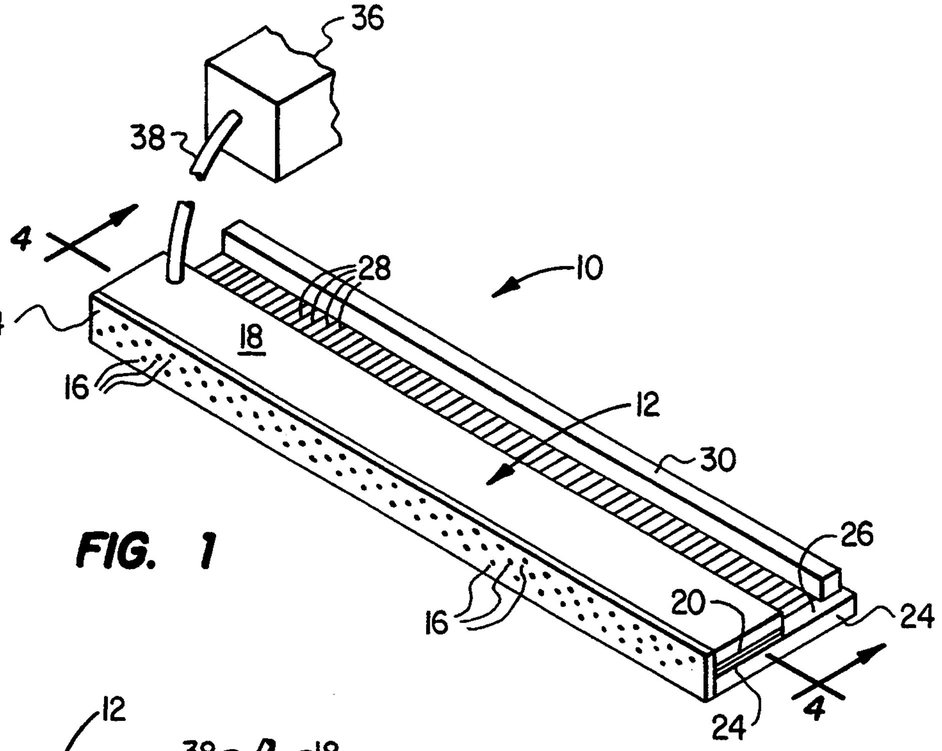
FIG. 1 is a simplified, somewhat schematic perspective view of a page wide piezoelectric ink jet printhead assembly embodying principles of the present invention.

Referring initially to FIGS. 1–4, the present invention provides a uniquely constructed page wide piezoelectric ink jet printhead assembly 10 having an elongated rectangular body portion 12. An elongated rectangular discharge orifice plate 14 is secured to and covers a front side surface of the body 12 and has a spaced series of small ink jet orifices 16 extending rearwardly therethrough into the interior of the printhead body 10 as later described.

Figure 2:
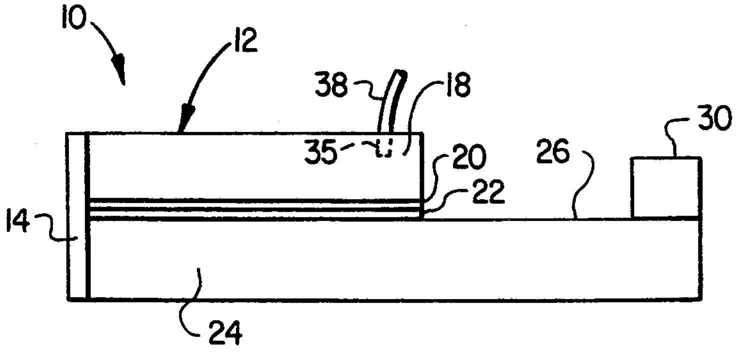
FIG. 2 is an enlarged scale right end elevational view of the printhead assembly.
Figure 3:
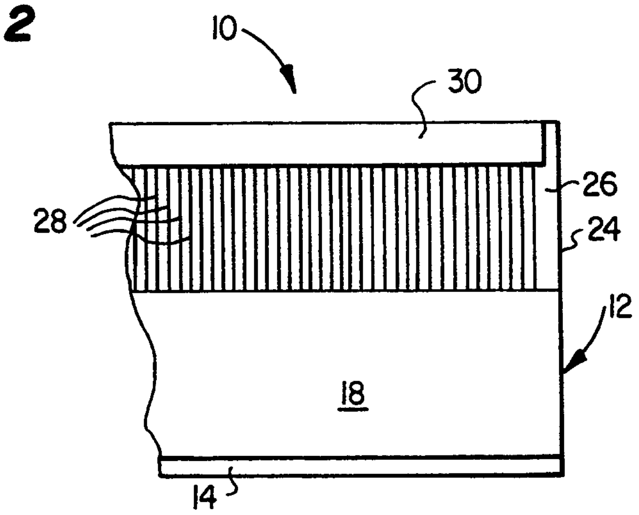
FIG. 3 is an enlarged scale top plan view of a right end portion of the printhead assembly.
Figure 4A:
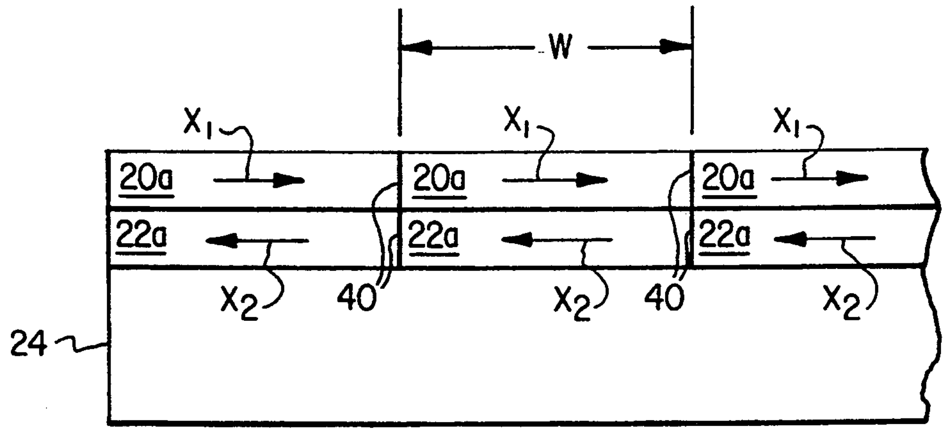
FIGS. 4A and 4B are enlarged scale, highly schematic cross-sectional views through the printhead assembly and sequentially illustrate, together with FIG. 4, a unique construction method of the present invention used to fabricate the printhead assembly.
Figure 4B:
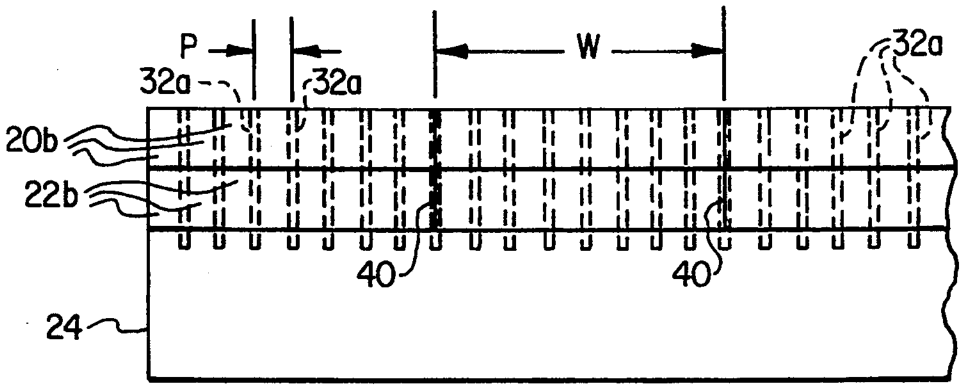
Figure 4:
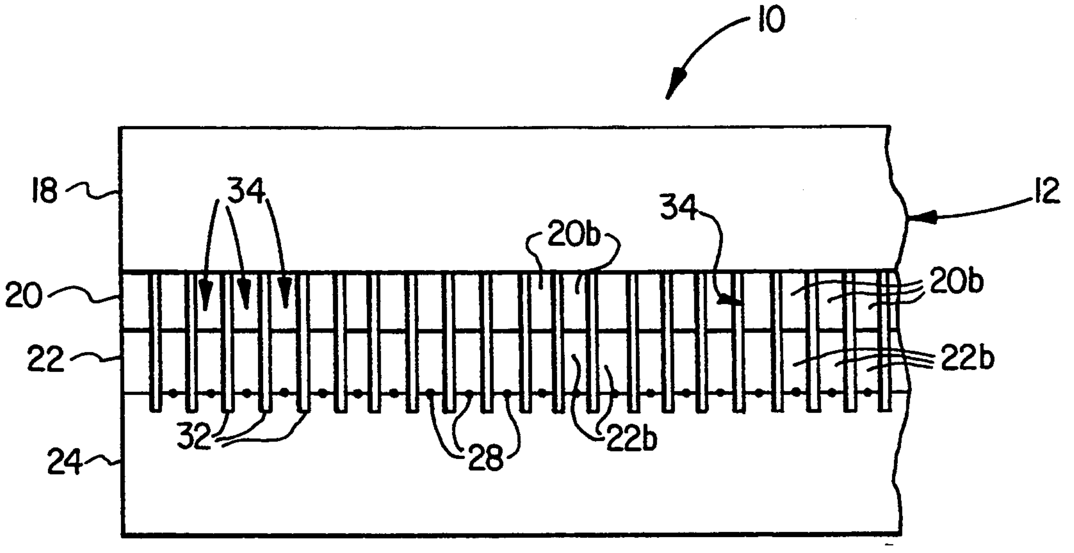
FIG. 4 is an enlarged scale, highly schematic partial cross-sectional view through the printhead assembly taken along line 4—4 of FIG. I.

From top to bottom as viewed in FIGS. 2 and 4, the printhead body 12 comprises intersecured elongated rectangular sections 18, 20, 22 and 24. As may best be seen in FIGS. 2 and 3, body sections 18, 20 and 22 are horizontally aligned with one another, and the bottom body section 24 extends rearwardly beyond the other body sections and has an exposed top side surface area 24. Body sections 18 and 24 are formed from a nonpoled piezoceramic material, preferably a PZT material, and body sections 20 and 22 are formed, as later described, from a poled piezoceramic material, preferably a PZT material.

Extending along the exposed top side surface 26 of the printhead body section 24 is a spaced series of parallel, electrically conductive surface traces 28. Each of the traces 28 longitudinally extends in a front-to-rear direction along the top side surface 26, with the front ends of the traces 28 being conductively connected to segments of the printhead body section 22 (see FIG. 4). The rear ends of the surface traces 28 are operatively connected to a suitable electronic driver 30 mounted atop the body surface 26 rearwardly of the body sections 18, 20 and 22. The driver 30 is used to transmit electrical actuating signals to segments of the body section 22 to piezoelectrically cause ink, in droplet form, to be forwardly discharged from the orifices 16 as subsequently described herein.

Referring now to FIG. 4, a horizontally spaced series of elongated, parallel ink receiving channels 32 are formed within the printhead body 12, with each of the channels 32 longitudinally extending rearwardly from the orifice plate 14 and having a front end communicating with one of the ink discharge orifices 16. The channels 32 are horizontally interdigitated with a spaced series of internal sidewall actuator sections 34, with each channel being laterally bounded along its length by a horizontally opposing pair of sidewall actuator sections 34.

The rear ends of the channels 34 communicate with an ink receiving manifold 35 (see FIG. 2) formed within the upper printhead body section. This internal manifold, in turn, is communicated with a suitable ink supply vessel 36 (see FIG. 1) via an ink delivery tube 38.

When it is desired to discharge ink, in droplet form, from one of the channels 32 through its associated discharge orifice 16 electrical driving voltage signals from the driver 30 are transmitted via the appropriate pair of surface traces 28, to the opposed pair of sidewall actuator sections 34 that bound the channel. The receipt of these voltage signals causes the two sidewall actuator sections to piezoelectrically deflect into the channel, thereby constricting the channel and causing ink therein to be forced outwardly through its associated discharge orifice 16.

As mentioned previously, the printhead assembly 10 is a "page wide" assembly, meaning that it is sized to longitudinally extend along essentially the entire width of a print medium sheet passing through the printer and remain stationary during the printing process, as opposed to having a width much less than the paper width and being shuttled back and forth across the sheet as it traverses the printer. Representatively, the length of the illustrated printhead assembly 10 is about 8.5". However, its length could be made longer or shorter if desired, Heretofore the fabrication of piezoelectric printhead assemblies in page wide lengths has been difficult if not impossible due to the poling width limitations inherent in piezoelectric sections used to build the printhead body. As a practical matter, the voltage required to properly pole a piezoelectric body section becomes unacceptably high as the width of the section, in the poling direction, is increased much beyond an inch or so. Additionally, attempts to pole a piezoelectric body section having a width greater than about one inch can result in cracking of segments of the poled section when they are later piezoelectrically deflected.

These problems are overcome, in a manner providing the piezoelectric printhead assembly 10 with its advantageous page width length depicted in FIG. 1, using a unique printhead body fabrication technique which will now be described in conjunction with FIGS. 4–4B.

According to principles of the present invention, to form the printhead body sections 20 and 22 two series of separate, rectangularly configured piezoceramic blocks 20*a* and 22*a* (see FIG. 4A) are provided. Each of the blocks 20*a*,22*a* has a front-to-rear length identical to the printhead body sections 20 and 22, and a horizontal width W (as viewed in FIG. 4A) are of not more than about one inch. The separate piezoceramic blocks 20*a* are then suitably poled in directions $X_1$ parallel to their widths, and the separate piezoceramic blocks 22a are suitably poled in directions $X_2$parallel to their widths.

The poled blocks 20a,22a are then secured to one another, and to the top side of the unpoled piezoceramic printhead body section or substrate 24, in the arrangement illustrated in FIG. 4, using a suitable electrically conductive epoxy material. In such arrangement the blocks 22a extend across the top side of the body section 24 in a side-to-side orientation with their poling directions $X_2$ being identical to one another, and the blocks 20a extend across the top sides of the blocks 22a with their poling directions extending oppositely to those of the blocks 22a. Furthermore, the side-to-side joint lines of the block series 20a,22a are horizontally aligned with one another in a manner such that in the intersecured array of blocks 20a,22a a series of vertical joint lines 40, horizontally spaced apart along the left-to-right length of the partially assembled printhead body, are formed.

Next, as schematically depicted in FIG. 4B, a horizontally spaced series of vertical saw cuts 32a (that ultimately define in the finished printhead body the interior ink receiving channels 32 shown in FIG. 4) are made downwardly through the vertically intermediate printhead body portion defined by the intersecured series of blocks 20a and 22a, and a relatively short distance into the top side of the bottom printhead body section 24.

As shown in FIG. 4B, the resulting grooves formed by the saw cuts 32a also horizontally separate the intersecured series of blocks 20a and 22a into horizontally shorter segments 20b and 22b that are vertically stacked in pairs, each such stacked pair segments 20b,22b defining one of the internal sidewall actuator sections 34 as indicated in FIG. 4.

In accordance with an important aspect of the present invention, the pitch P of the saw cuts 32a (i.e., the identical horizontal spacing between each adjacent pair of saw cuts) is selected in a manner such that the block width W is a predetermined even multiple of the pitch P, and the series of saw cuts 32a is horizontally oriented in a manner such that a saw cut 32a extends vertically through each of the block joints 40 as illustrated in FIG. 4B. In this manner, none of the sidewall actuator sections 34 (see FIG. 4) has a vertical joint therein which could potentially weaken the sidewall section in its lateral deflection mode or electrically alter its operation.

After the saw cuts 32a are formed, the upper printhead body section 18 is adhesively bonded to the upper sides of the block segments 20b (see FIG. 4), thereby closing off the top sides of the channels the orifice plate 14 (see FIG. 1) is operatively installed, and the open rear ends of the channels 32 are appropriately sealed off.

The foregoing detailed description is to be clearly understood as being given by way of illustration and example only, the spirit and scope of the present invention being limited solely by the appended claims.

What is claimed is:

1. A method of fabricating a page wide piezoelectric ink jet printhead, said method comprising the steps of:

providing a first series of piezoelectric body sections each having opposite sides and a width extending therebetween;

providing a second series of piezoelectric body sections each having opposite sides and a width extending therebetween, the widths of said body sections in said first and second series thereof being substantially identical to one another;

poling said body sections in said first and second series thereof in widthwise directions;

intersecuring the poled first series of body sections in a side-to-side abutting relationship;

intersecuring the poled second series of body sections in a side-to-side abutting relationship;

attaching said first and second series of poled body sections to one another in a manner forming therefrom a first printhead body portion having parallel, essentially planar opposite first and second side surfaces between which aligned, generally planar side juncture areas of said first and second series of poled body sections transversely extend, and in which the polling directions of said first series of poled body sections are identically oriented, and the polling directions of said second series of poled body sections are identically oriented and extend oppositely to those of said first series of poled body sections;

providing a second printhead body portion having a generally planar first side surface;

securing said first side surface of said first printhead body portion to said first side surface of said second printhead body portion;

forming a series of equally spaced, parallel grooves through said first printhead body portion, after its securement to said second printhead body portion, each of said grooves extending from said second side surface of said first printhead body portion to at least said first side surface thereof, with a first number of said grooves extending through and removing all of said side juncture areas of said first printhead body portion, and a second number of said grooves being interdigitated with said first number of said grooves, said grooves having open front and rear ends and open side portions extending between said open front and rear ends;

providing a third printhead body portion having a generally planar first side surface;

securing said first side surface of said third printhead body portion to said second side surface of said first printhead body portion in a manner such that said third printhead body portion extends across and covers said open side portions of said grooves;

securing a plate member to said first, second and third printhead body portions over said open front ends of said grooves, said plate member having a spaced series of ink discharge orifices formed therein and communicating with said open front ends of said grooves; and sealing off said open rear ends of said grooves.

2. The method of claim 1 wherein:

said forming step is carried out by forming a spaced series of parallel saw cuts in said first printhead body portion.

3. The method of claim 2 wherein:

said series of saw cuts have a cut-to-cut pitch, and said method further comprises the step of relating the widths of said body sections in said first and second series thereof in a manner such that said widths are equal multiples of said saw cut pitch.

4. The method of claim 1 wherein:

said forming step is carried out in a manner extending said grooves at least a short distance into said second printhead body section.

5. The method of claim 1 wherein:

said body sections in said first and second series thereof are formed from a piezoceramic material, and said intersecuring and attaching steps are performed using an electrically conductive adhesive material.

6. The method of claim 1 wherein:

the widths of said body sections in said first and second series thereof are not substantially greater than about one inch.

* * * * *